United States Patent [19]

Erlam

[11] Patent Number: 4,461,384
[45] Date of Patent: Jul. 24, 1984

[54] CARD FRAMES

[75] Inventor: David P. Erlam, Winchester, England

[73] Assignee: Rittal-Werk Rudolf Loh GmbH & Co. Kg., Fed. Rep. of Germany

[21] Appl. No.: 392,160

[22] Filed: Jun. 25, 1982

[30] Foreign Application Priority Data

Jun. 29, 1981 [GB] United Kingdom ................. 8119941

[51] Int. Cl.³ ...................... B65D 69/00; B65D 71/04; B65D 85/30
[52] U.S. Cl. .................................... 206/577; 206/223; 206/334; 206/453; 206/485; 211/41; 312/108
[58] Field of Search .............. 206/223, 334, 453, 454, 206/577, 485; 312/108; 211/41

[56] References Cited

U.S. PATENT DOCUMENTS

| | | | |
|---|---|---|---|
| 2,256,995 | 9/1941 | Andres | 206/485 |
| 2,281,657 | 5/1942 | Aquino | 206/454 |
| 2,337,468 | 12/1943 | Hilger | 206/454 |
| 2,556,360 | 6/1951 | Clemons | 206/577 |
| 2,673,596 | 3/1954 | Von Haase | 206/577 |
| 3,838,777 | 10/1974 | Thornicraft | 211/41 |
| 4,002,233 | 1/1977 | Page, Jr. | 206/577 |
| 4,091,928 | 5/1978 | Bernardo | 206/577 |
| 4,167,903 | 9/1979 | Lasher | 206/577 |

FOREIGN PATENT DOCUMENTS

| | | |
|---|---|---|
| 1220354 | 1/1971 | United Kingdom. |
| 2010102 | 6/1979 | United Kingdom. |

Primary Examiner—William T. Dixson, Jr.
Assistant Examiner—Brenda J. Ehrhardt
Attorney, Agent, or Firm—Maky, Renner, Otto & Boisselle

[57] ABSTRACT

A card frame kit includes end lates (10a, 10b) and cross rails (16) that can be assembled together to form the card frame. The kit is packaged in a box (30) with the end plates (10a, 10b) laid flat. When the kit is to be assembled, the box (30) is used as a temporary, disposable jig. To this end, inserts (40) that receive the cross-rails (16) comprise slots (44) in which the side plates (10a, 10b) can be stood up in the relative orientation they are to adopt in the assembled card frame. The assembler thus has his hands free to assemble at least some of the cross rails (16) to the side plates (10a, 10b) to form a self-supporting structure that can then be removed from the jig, if necessary or desired, to complete the assembly.

8 Claims, 6 Drawing Figures

CARD FRAMES

BACKGROUND OF THE INVENTION

1. Field of the Invention

This invention relates to card frames, and is more particularly directed to the packaging and erection thereof.

2. Description of the prior art

A 'card frame' (also known as a 'sub-rack') is a kind of frame structure used to house electrical circuitry mounted on 'cards' which, for example, comprise circuit boards, for instance printed circuit boards, mounting circuit components. A typical card frame comprises a pair of side plates spaced apart by generally horizontally extending cross rails secured at their ends to the side plates, the cross rails typically mounting card guides for receiving the cards and connectors for making electrical connections to the cards.

Card frames are often manufactured by specialist manufacturers and supplied by them, in kit form, to the end user. The end user is typically an electronics manufacturer who manufactures circuit cards and erects or assembles the card frame from the kit into a particular form suited to the precise requirements of the end product to be assembled from the cards and card frame.

An advantage of the card frame is that once the basic structure thereof has been erected by securing together the side plates and at least some of the cross rails, the structure acts to some extend as its own jig for further assembly purposes. However, the initial assembly of the basic structure can be difficult since it tends to be a job for which two hands are not enough.

SUMMARY OF THE INVENTION

The present invention provides a packaged card frame kit comprising a pair of side plates and a plurality of cross rails that can be assembled together to form at least part of a card frame, and a box capable of accommodating the side plates and cross rails. The box is designed to accommodate the side plates in a laid flat condition for transport and is provided with guide means allowing the side plates to be stood up in the relative orientation they adopt when the card frame is assembled. By virtue of the above arrangement, a card frame kit can be packed in a compact configuration and shipped to a user in such configuration. Once the user receives and opens the box, he can stand up the side plates in their relative use orientation and then has two hands free to then secure together at least some of the cross rails and the side plates to complete an initial stage of erecting the card frame, the box thus acting as a disposable and ready-to-hand jig to enable this process to be carried out. The side plates will then be held in or substantially in their relative use orientation by the cross rails that have been secured to them whereby any remaining cross rails and other components of the card frame can be assembled in a convenient manner.

The invention can, of course, be carried into effect in a variety of ways. Preferably, however, the box is generally in the form of a tray and the guide means comprises slots formed towards opposite ends of the tray, preferably in respective inserts received within opposite ends of the tray. The said inserts may comprise facing sets of cutouts for receiving opposite ends of the cross rails in such a manner that the cross rails extend generally parallel to one another and adjacent to the side plates when the latter are laid out flat in the box. In this way, the kit can take up a particularly compact form.

The said inserts may take a variety of forms. They may for example be moulded from expanded polystyrene or the like. Preferably, however, the inserts comprise folded cardboard cutouts.

BRIEF DESCRIPTION OF THE DRAWINGS

The invention will now be further described, by way of illustrative and non-limiting example, with reference to the accompanying drawings, in which.

DETAILED DESCRIPTION

Figure 1:
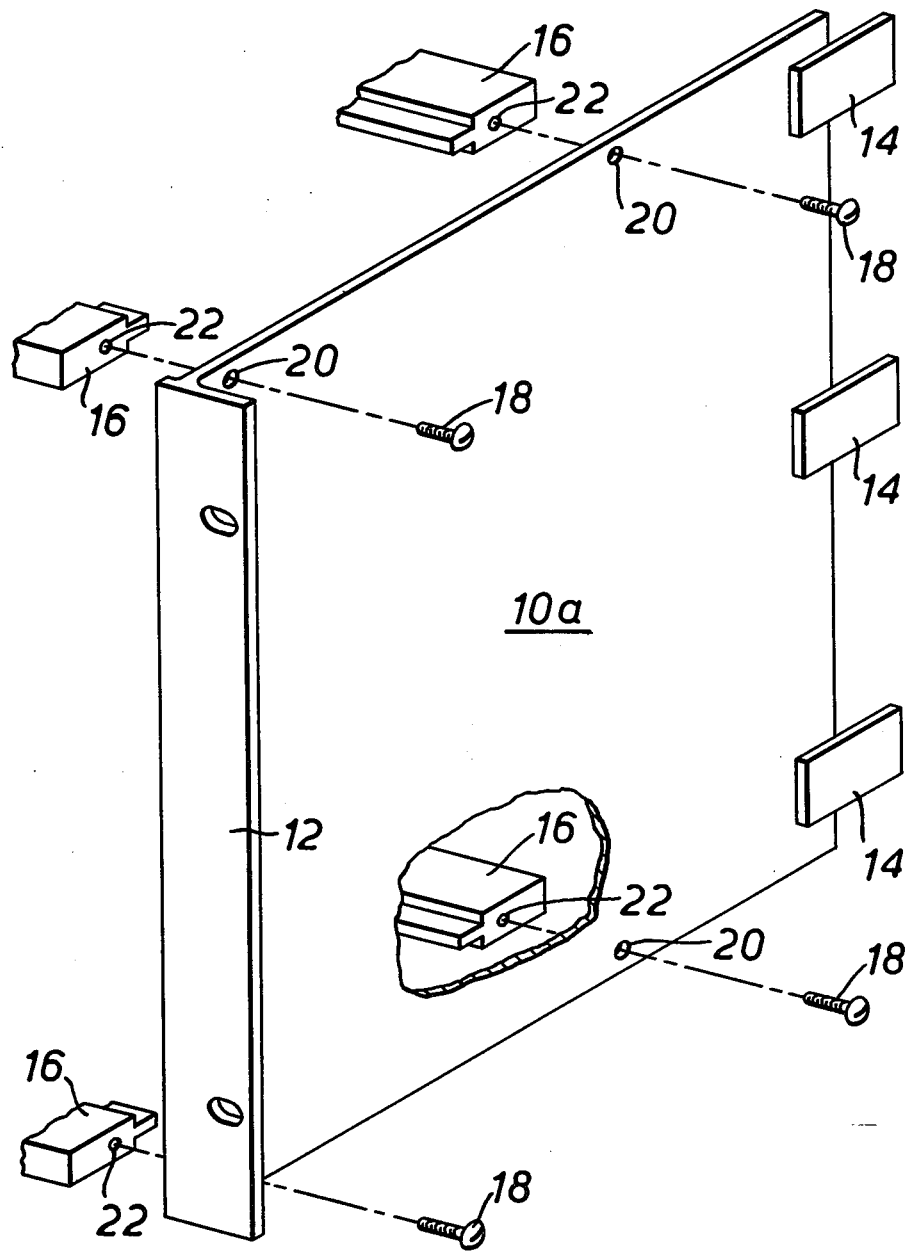
FIG. 1 is an exploded perspective view of one end of a card frame.

Referring first to FIG. 1 of the accompanying drawings, the illustrated card frame comprises a right-hand side plate 10a having a front mounting flange 12 and three outriggers 14 extending rearwardly from the rear edge thereof. The illustrated card frame further comprises a second side plate 10b, which is not shown in FIG. 1. The second side plate 10b, which is identical to the side plate 10a and is disposed at the other or left hand end of the card frame, is oriented in the same manner as the right hand side plate 10a except that it is rotated through 180° through an axis extending from its front to its rear. In other words, the two side plates 10a, 10b lie in vertical planes spaced apart from one another and their flanges 12 extend outwardly from the sides of the card frame at the front.

When the card frame is erected, the side plates 10a, 10b are maintained in the above relative orientation by cross rails 16 that extend between the two side plates 10a, 10b and are secured at their ends to the side plates by virtue of screws 18 that extend through clearance holes 20 in the side plates into tapped holes 22 in the ends of the cross rails 16. In a manner well known to those skilled in the art, card guides (not shown) extend between the front and rear cross-rails 16 to accommodate cards inserted into the card frame. Further, other cross rails (not shown) are connected between the side plates 10a, 10b to mount connectors used to make electrical connections to cards (not shown) inserted into the card frame.

Figure 2:
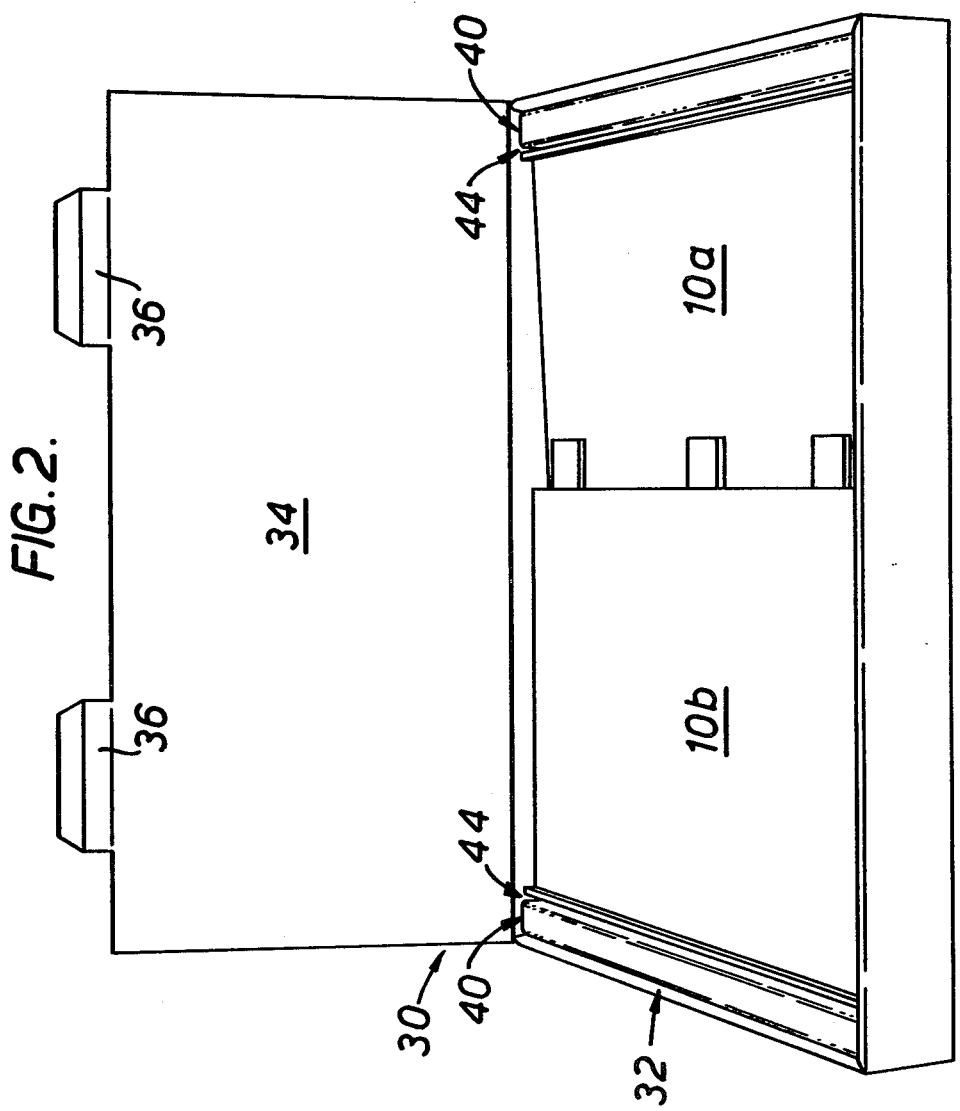
FIG. 2 is a perspective view of the card frame, prior to assembly, accommodated in a box.
Figure 3:
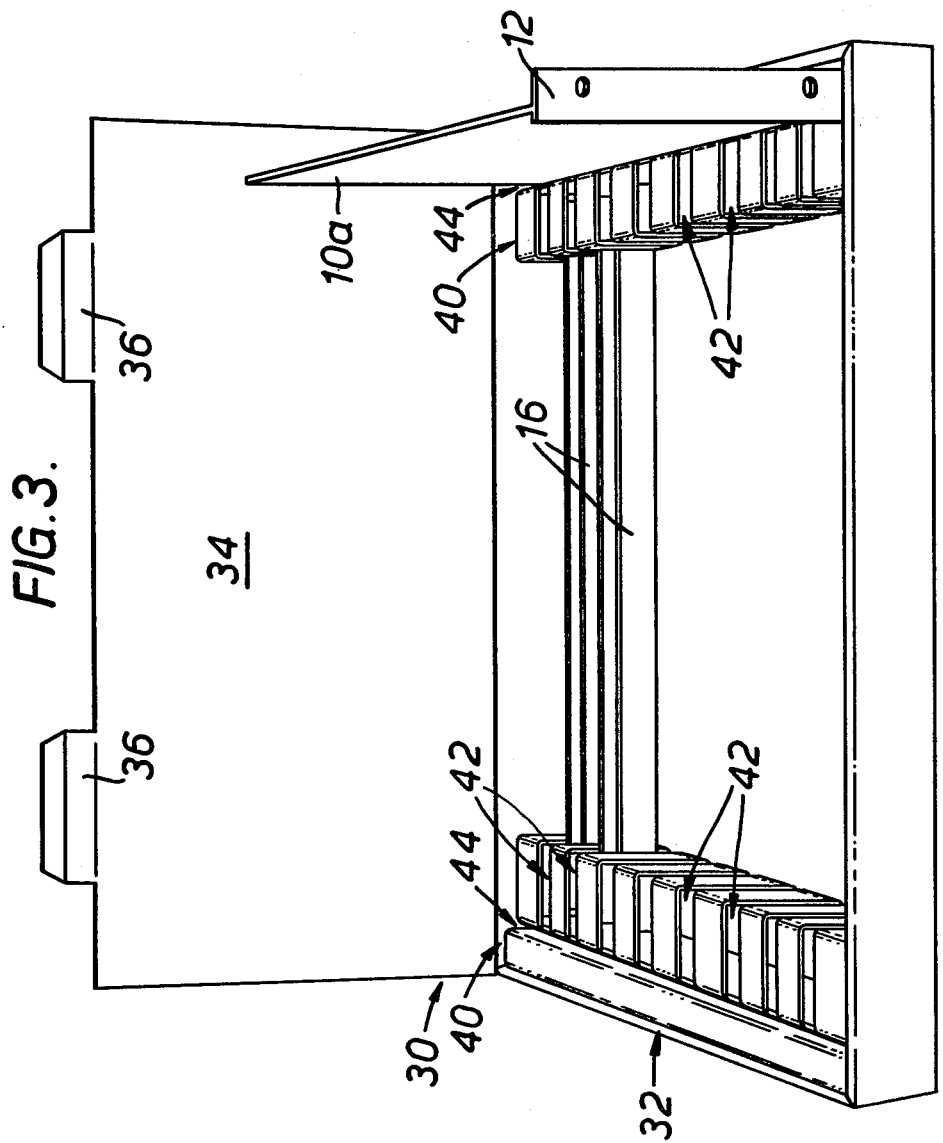
FIG. 3 is a view corresponding to FIG. 2, showing two side plates of the card frame removed from the box and one of them stood up in the box in its use position.

Prior to erection or assembly, the card frame is packed in the form of a kit in a cardboard box 30 shown in FIGS. 2 and 3. The box 30 comprises a tray 32 having a lid 34 which is hinged thereto and is provided with closure tabs 36. A pair of like folded cardboard inserts 40 are disposed one at each end of the tray 32. As can best be seen from FIG. 4, each insert 40 is folded from a cardboard blank to form an elongate box section having a plurality of spaced cut-outs 42 and a continuous elongate slot 44.

Figure 4:
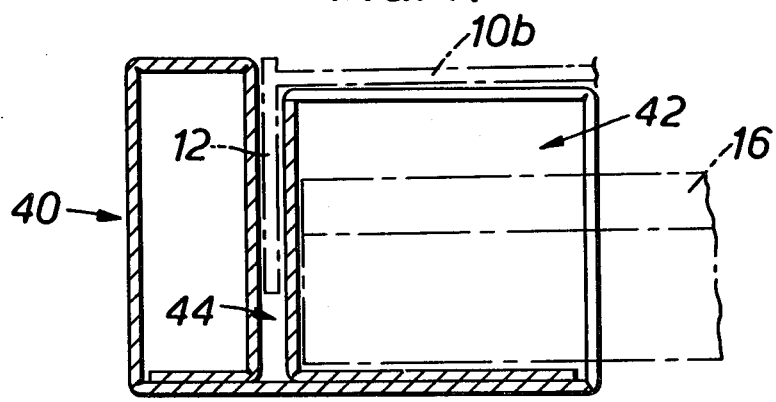
FIG. 4 is a transverse cross section through one of a pair of folded cardboard inserts of the box.

As can best be seen from FIGS. 3 and 4, when the card frame kit is packed in the box 30 the cross rails 16 (and optionally other non-illustrated cross rails) are housed in the slots 42 by virtue of one end of each cross rail being accommodated in a cut-out 42 in one insert 40 and the other end being accommodated in a corresponding cut-out in the other insert 40.

Figure 5:
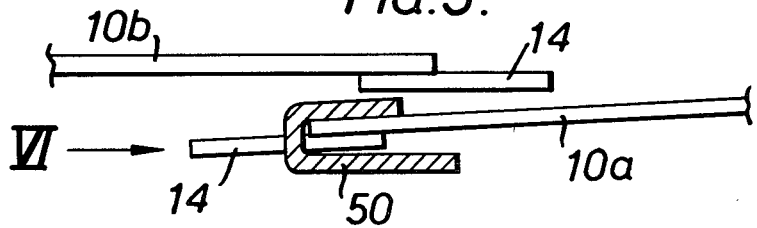
FIG. 5 is a scrap sectional view showing the region where the ends of the side plates that are disposed rearwardly when the card frame is erected lie adjacent one another when it is disassembled in the box.
Figure 6:
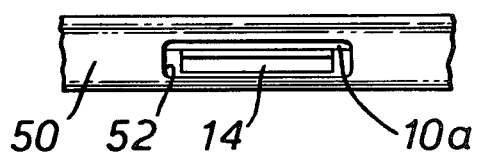
FIG. 6 is a scrap view of the structure shown in FIG. 5, taken in the direction of the arrow VI in FIG. 5.

As can best be seen from FIGS. 2 and 4, the side plates 10a and 10b are laid out flat adjacent one another in the tray 32, above the cross rails 16, the flanges 12 lying in the slots 44. As a final protective measure, as can best be seen from FIGS. 5 and 6, a roughly U-shaped strip 50 of cardboard having cut-outs 52 for the outriggers 14 of the side plate 10a is disposed as shown around the edge of the plate 10a to form a cushion against impact between the plates 10a and 10b. To complete the package, the lid 34 is closed and secured in place. The card frame kit is stored and transported in such condition.

When the user wishes to erect the kit, he opens the box 30 and removes the side plates 10a and 10b, which he then stands up in the slots 44 in the inserts 40 as shown for the right hand side plate 10a in FIG. 3. (To this end, there will be sufficient space between the fronts of the inserts 40 and the inside of the front of the box 30 to permit the flanges 12—when provided—to enter therebetween). The two side plates 10a and 10b are thus held at least approximately in their relative use orientation whereby the operator has his hands free to commence erection by virtue of using the box as a jig to hold the side plates. That is to say, the operator can remove and assemble sufficient of the cross rails 16 to hold the structure in a substantially rigid condition, whereupon he can remove the so-erected structure from the box to continue the erection of any remaining cross rails 16 and the further components of the card frame, which further components may have been packed in the box 30 or shipped separately.

I claim:

1. A packaged card framd kit comprising a pair of side plates, a plurality of cross rails that can be assembled together with the side plates to form at least part of a card frame, and a box capable of housing said side plates and cross rails for transporting said side plates and cross rails, each of said side plates comprising a main body portion, each cross rail adapted to be secured to said main body portions of said side plates when said side plates are in a predetermined upright orientation with said main body portions spaced apart by a predetermined distance, said box including support means for supporting said side plates with said main body portions in a laid flat condition during transport, said support means also including a pair of first receptor means spaced apart by said predetermined distance and adapted to engage portions of said side plates and to support said side plates in said predetermined upright orientation with said main body portions spaced apart by said predetermined distance, said support means further including second receptor means associated with each of said first receptor means, said second receptor means adapted to engage end portions of said cross rails and maintain said cross rails in a predetermined orientation in which said cross rails extend between said first receptor means during transport, said second receptor means allowing movement of the cross rails between the side plates when the side plates are in said predetermined upright orientation, to allow attachment of the cross rails to the side plates while the side plates are in said upright orientation.

2. A kit according to claim 1, wherein said support means comprises a pair of insert members disposed in spaced apart relation to each other in said box, said first receptor means including (i) a respective longitudinal slot disposed in each insert member and (ii) a respective transverse slot defined between each insert member and an adjacent side wall of the box, the longitudinal slots in the insert members being spaced apart by said predetermined distance and adapted to receive the main body portions of the side plates when the side plates are in the predetermined upright orientation, the transverse slots being adapted to receive respective flanges on the side plates when the side plates are in the predetermined upright orientation, the second receptor means comprising additional transverse slots formed in each of said insert members, each of the additional transverse slots extending from the longitudinal slot in its associated insert member and toward the other of said insert members.

3. A kit according to claim 1, wherein said box is generally in the form of a tray and said first receptor means comprises a pair of slots formed towards opposite ends of the tray.

4. A kit according to claim 3, wherein said slots are formed in respective inserts received within opposite ends of said tray.

5. A kit according to claim 4, wherein said inserts comprise facing sets of cutouts for receiving opposite ends of said cross rails in such a manner that the cross rails extend generally parallel to one another and adjacent to said side plates when the side plates are laid in said flat condition in said box.

6. A kit according to claim 5, wherein said inserts comprise folded cardboard box sections.

7. A kit according to claim 4, wherein said inserts comprise folded cardboard box sections.

8. A kit according to claim 3, claim 4 or claim 5, wherein said side plates include flanges and the flanges are located in said slots when the side plates are in said laid flat condition in said tray.

* * * * *